United States Patent [19]

Saito et al.

[11] Patent Number: 5,420,077

[45] Date of Patent: * May 30, 1995

[54] METHOD FOR FORMING A WIRING LAYER

[75] Inventors: Satoshi Saito, Ikoma; Keizo Sakiyama, Kashihara, both of Japan

[73] Assignee: Sharp Kabushiki Kaisha, Osaka, Japan

[*] Notice: The portion of the term of this patent subsequent to Nov. 24, 2009 has been disclaimed.

[21] Appl. No.: 20,799

[22] Filed: Feb. 22, 1993

Related U.S. Application Data

[63] Continuation-in-part of Ser. No. 720,298, Jun. 28, 1991, abandoned.

[30] Foreign Application Priority Data

Jun. 29, 1990 [JP] Japan .................................. 2-173806

[51] Int. Cl.6 .................... H01L 21/265; H01L 21/465
[52] U.S. Cl. ..................................... 437/228; 437/233; 437/241; 437/187; 437/982
[58] Field of Search ................ 437/228, 233, 241, 235, 437/187, 197, 60; 156/644, 653

[56] References Cited

U.S. PATENT DOCUMENTS

| | | | |
|---|---|---|---|
| 4,364,167 | 12/1982 | Donley | 437/241 |
| 4,882,289 | 11/1989 | Moriuchi et al. | 437/235 |
| 5,059,548 | 10/1991 | Kim | 437/233 |
| 5,061,651 | 10/1991 | Ino | 437/60 |
| 5,063,176 | 11/1991 | Lee et al. | 437/228 |
| 5,070,032 | 12/1991 | Yuan et al. | 437/233 |
| 5,082,801 | 1/1992 | Nagata | 437/195 |
| 5,166,088 | 11/1992 | Ueda et al. | 437/60 |

FOREIGN PATENT DOCUMENTS

| | | | |
|---|---|---|---|
| 58-32434 | 2/1983 | Japan | 437/235 |
| 60-261132 | 12/1985 | Japan | 437/233 |
| 62-78851 | 4/1987 | Japan | 437/233 |
| 63-254745 | 10/1988 | Japan | 148/DIG. 1 |
| 0108629 | 1/1989 | Japan | 437/187 |
| 2140953 | 5/1990 | Japan | 437/228 |
| 2237137 | 9/1990 | Japan | 437/228 |

OTHER PUBLICATIONS

Wolf et al. "Silicon Processing for the VLSI ERA" vol. 1, pp. 520, 1986, pp. 559–561.
Wolf et al; "Silicon Processing for the VLSI"; vol. 1; 1986; pp. 175–177, 531–534, 581.

*Primary Examiner*—Brian E. Hearn
*Assistant Examiner*—Michael Trinh
*Attorney, Agent, or Firm*—Nixon & Vanderhye

[57] ABSTRACT

A method for a wiring layer on a semiconductor substrate wherein a contact hole for a wiring layer is formed by laminating a lower insulating layer and an etching barrier layer on the semiconductor substrate providing electrodes via a gate insulating film, forming a hole in the etching barrier layer using a first mask pattern having a hole pattern in which a diameter of the hole thereof is larger than that of the contact hole to be formed, laminating an upper insulating layer and a second mask pattern having a hole pattern in which a diameter of the hole thereof is substantially the same as that of the contact hole, subjecting the lower and upper insulating layers and the gate insulating film to an isotropic etching and an anisotropic etching, utilizing the second mask pattern, thereby forming a contact hole having no exposure of the etching barrier layer at the side of wall of the contact hole.

4 Claims, 3 Drawing Sheets

METHOD FOR FORMING A WIRING LAYER

This is a continuation-in-part of application Ser. No. 07/720,298, filed Jun. 28, 1991, now abandoned.

BACKGROUND OF THE INVENTION

1. Field of the Invention

The present invention relates to a method for forming a wiring layer on a semiconductor substrate and more particularly to a method for forming a contact hole to ensure good quality of the wiring layer.

2. Description of the Prior Art

In general, there has been used a technique of contact hole formation in which gate electrodes, capacitors and the like are formed on a semiconductor substrate, and a CVD-$SiO_2$ film having good coverage, or a PSG or BPSG film is used for a layer insulation film to be subjected to fellow by high-temperature annealing for flattening so that a contact hole is formed. In addition, there has been used a combination technique of isotropic etching and anisotropic etching as well as a taper etching technique and a contact reflow technique in order to improve the coverage of a sputtering metal to be used in the subsequent electrode formation.

In that case, it is necessary to precisely control quantity of isotropic etching so as not to come into contact with an electrode wire on a substrate. As a countermeasure, a high-resistance film such as a SiN film having a thickness of about 200 Å is inserted into the underside of the layer insulation film such as the PSG or BPSG film so as to function as an etching barrier layer for isotropic etching by an etching solution having a capacity ratio of 10 ($H_2O$):1 (HF and $NH_4F$), i.e., BHF (buffered hydrofluoric acid).

Referring to the above-mentioned technique of contact hole formation, a contact hole 23 is formed on a semiconductor substrate 22 having gate electrodes 21 with a hood 24a of a SiN etching barrier layer 24 remaining therein as shown in FIG. 2. In that state, a metal is laminated and then wiring is patterned. A gate insulating film is indicated at 25, and a layer insulation film is indicated at 26 and 27.

In the process of removing a native oxide film which is to be performed after forming the contact hole 23 and before laminating the metal (a wet treatment by BHF having a mixing ratio of 100:1), only the SiN etching barrier layer is not etched so that the hood 24a remains as shown in FIG. 2. The coverage of the metal to be formed by a sputtering method is deteriorated owing to the hood 24a. In the extreme case, disconnection is caused.

It is an object of the present invention to provide a method for forming a wiring layer in which an etching barrier hood can be prevented from remaining in a contact hole even though a wet treatment is performed before metal deposition in the case where the contact hole is to be formed by means of an etching barrier layer.

SUMMARY OF THE INVENTION

The present invention provides a method for forming a wiring layer on a semiconductor substrate comprising the steps of i) laminating a lower insulating layer and etching barrier layer in this order on the entire surface of the semiconductor substrate having electrodes, ii) forming a hole in the etching barrier layer by etching using a first mask pattern having a hole pattern in which a diameter of the hole thereof is larger than that of the contact hole but smaller than a distance between two electrodes, followed by removal of the first mask pattern, iii) laminating an upper insulating layer on the entire surface of the substrate so as to planarize its entire surface, followed by lamination of a second mask pattern having a hole pattern in which a diameter of the hole thereof is substantially the same as that of the contact hole and the hole is located within the hole of the first mask pattern, iv) subjecting the lower and upper insulating layers and the gate insulating film to an isotropic etching followed by an anisotropic etching, using the second mask pattern to form a contact hole having no exposure of the etching barrier layer at the side wall of its contact hole, and v) forming a wiring layer in an area including the contact hole after removal of the second mask pattern.

DETAILED DESCRIPTION OF A PREFERRED EMBODIMENT

Figure 1A:
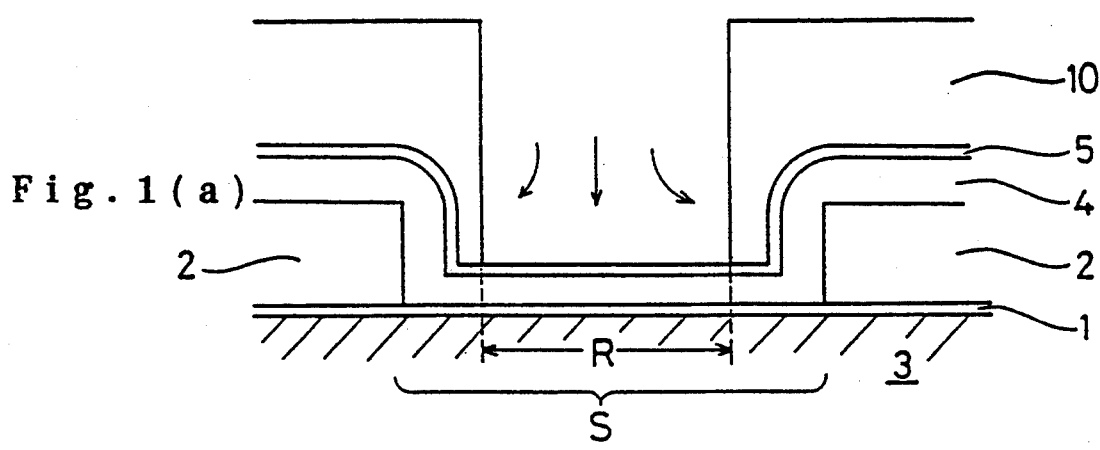
FIGS. 1(a) to 1(f) are diagrams showing manufacturing steps according to an embodiment of the present invention.

The forming method of the present invention is characterized in that only a contact hole formation portion of an etching barrier layer is etched and removed in advance of forming a contact hole, the etching barrier layer being used as an etching barrier for angle cutting of a first step and for securing the thickness of a insulating layer to protect a lower wire such as a gate electrode.

According to the present invention, in the case where the contact hole is to be formed by means of an etching barrier layer, the etching barrier layer for angle cutting of the contact hole portion is laminated on the whole surface formed by a lower insulating layer in advance. Then, the etching barrier layer is etched to form a contact pattern in a contact formation region. The contact pattern has a hole diameter which is substantially larger than that of the contact hole to be subsequently formed. Thereafter, an upper insulating layer is laminated to form the contact hole for the sequentially formed metal wiring. Consequently, there can be eliminated the conventional drawback wherein the etching barrier layer is etched to form a hood which remains in the contact hole in the process of removing a native oxide film by a wet treatment which is to be performed before metal deposit.

Examples of the etching barrier layer are a SiN film, a polysilicon film, an amorphous Si film or the like which has a high resistivity of $10^9$ to $10^{12}$ ($\Omega$-cm).

This etching barrier layer can be formed by, for example, a low pressure CVD (LPCVD) method.

It is preferred that a dry etching method is used for a method for etching the etching barrier layer. An example of the dry etching method is a plasma etching method using $CF_4$ gas and $O_2$ gas. There can be also used the known etching methods for removing the SiN film, polysilicon film or amorphous Si film. By way of example, a wet etching method using thermal phosphoric acid can be used.

The lower insulating layer may comprise one or more layers. Such layers includes a $SiO_2$ film formed by CVD method.

The upper insulating layer can be formed by laminating PSG or BPSG with, for example, LPCVD method, or atmospheric pressure CVD method.

A preferred embodiment of the present invention will be described in detail with reference to the drawings. The present invention is not limited to the embodiment to be described below.

A $SiO_2$ film (a lower insulating layer) 4 having a thickness of 1500 Å and a SiN etching barrier layer 5 having a thickness of 200 Å are sequentially laminated on the whole surface of a Si substrate 3. The Si substrate 3 has a plurality of gate electrodes 2, 2 provided through a $SiO_2$ gate insulating film 1. A region between gate electrodes where a contact is formed is designated as S. Next, a photoresist is applied on the Si substrate 3 and the photoresist is exposed to form a hole having a layer diameter R larger than the diameter r of a contact hole to be formed later, thereby forming a first mask pattern 10. Here the end portion of the first mask pattern is present on the etching barrier layer within the stepped portion between the gate electrode.

Then, the etching barrier layer 5 is etched to form a contact pattern 6 in a contact formation region S between the gate electrodes 2, 2 by the first mask pattern 10. The contact pattern 6 has a diameter R of hole which is larger than a diameter r of a contact hole to be formed in the contact formation region S.

In that case, the $SiO_2$ film as the lower insulating layer 4 is formed at a thickness of about 1500 Å by a CVD method. SiN is laminated on the $SiO_2$ film at a thickness of about 100 to 200 Å by a LPCVD method. The contact pattern 6 is formed by using the first mask pattern 10. The contact pattern 6 has the hole diameter R of 1.0 μm which is larger than the diameter r of the contact hole by about 0.2 μm. At this time, there is removed SiN corresponding to the diameter R. Preferably, SiN is removed by a plasma etching method using $CF_4$ gas and $O_2$ gas [see FIG. 1(a)].

Figure 1B:
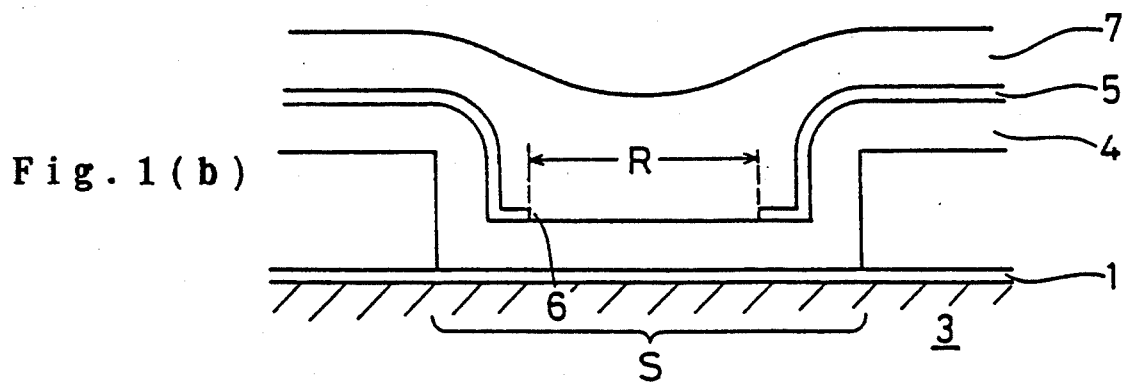

Then, a BPSG film is laminated at a thickness of 6000 Å on the whole surface. The BPSG film is subjected to reflow by the known high-temperature annealing so as to become flat. Consequently, a upper BPSG insulating layer 7 is formed [see FIG. 1(b)].

Figure 1C:
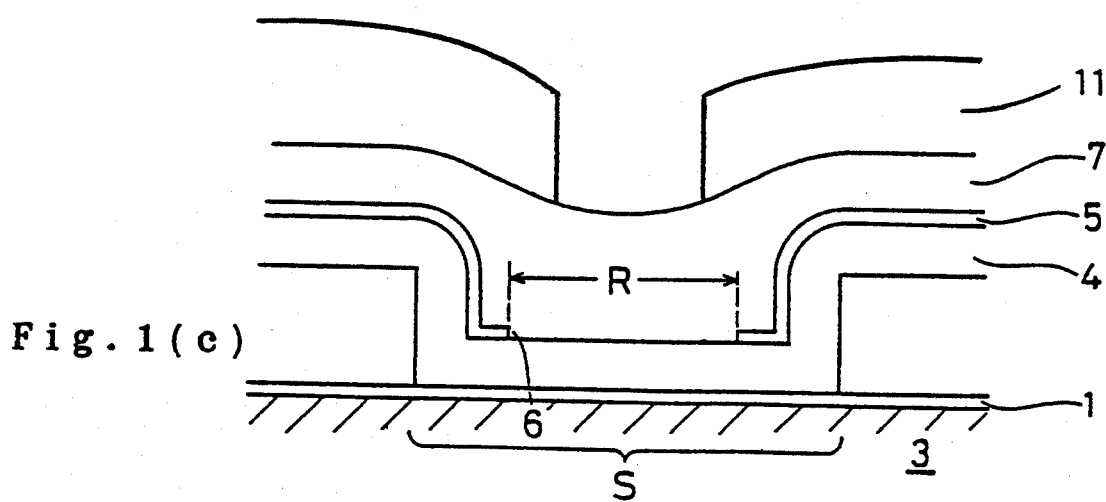

Subsequently, a photoresist is applied and subjected to light exposure to form a second mask pattern 11 for opening a contact hole. The mask pattern 11 is exposed in such a manner that a open end is retained in a position 0.2 μm away from the end of the contact pattern 6 retained in the contact formation region to a region where the etch-back layer is removed. Additionally, the opening has the same diameter r as a contact hole to be formed in the foregoing process mentioned hereinbelow [refer to FIG. 1(c)].

Figure 1D:
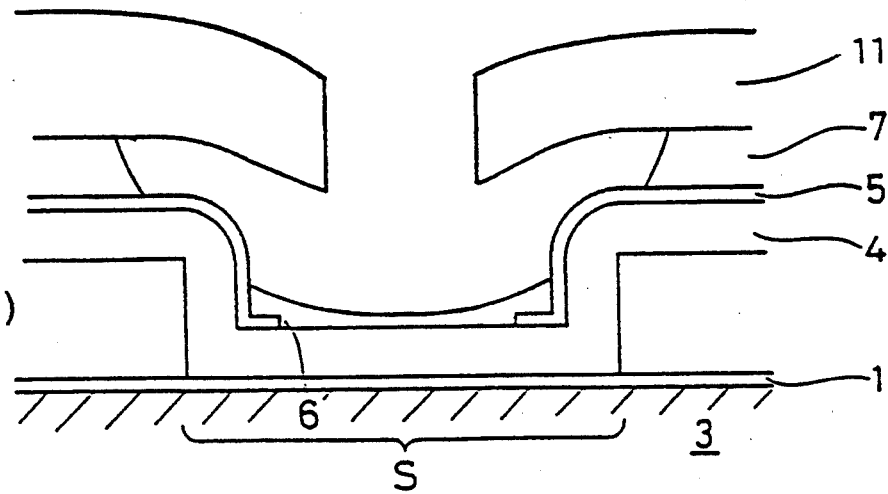

Then a known isotropic etching is performed using the BHF shown by 10:1 to form a contact hole, followed by etching the upper insulating layer 7. At this point, the lower insulating layer 4 provided in the step portion adjacent the electrodes is protected with an etching barrier layer 5, to be retained free from etch-back process [refer to FIG. 1(d)].

Figure 1E:
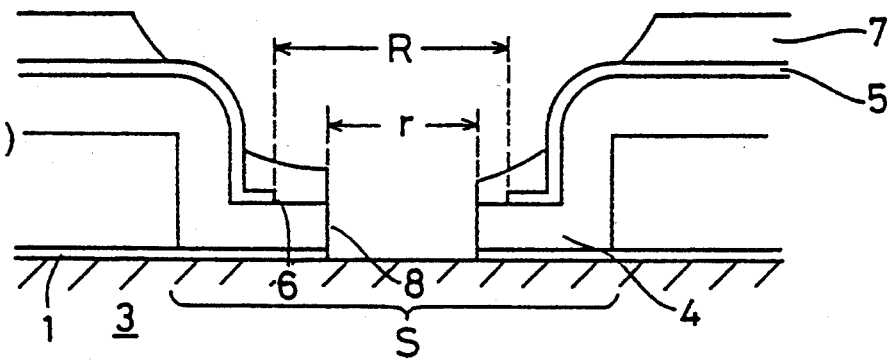

By the anisotropic etching, the upper insulating layer 7, the lower insulating layer 4 and the gate insulating film 1 between the gate electrodes are removed to provide a contact hole 8 having a diameter r of 0.8 μm, 0.2 μm smaller than the diameter R of the contact hole [refer to FIG. 1(e)].

Figure 1F:
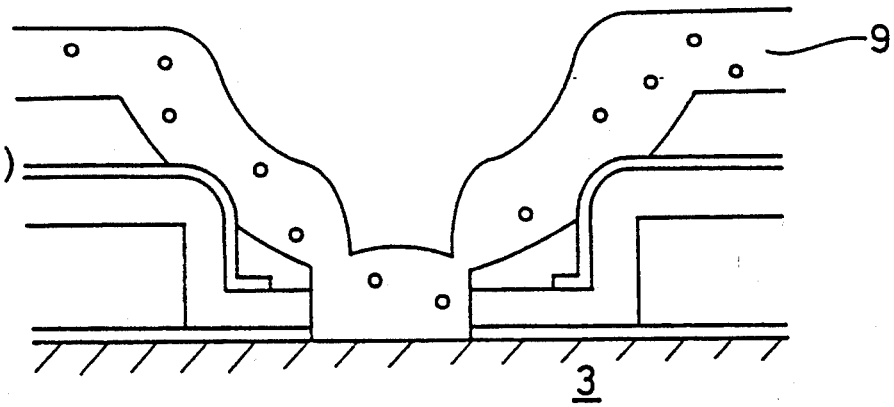
Figure 2:
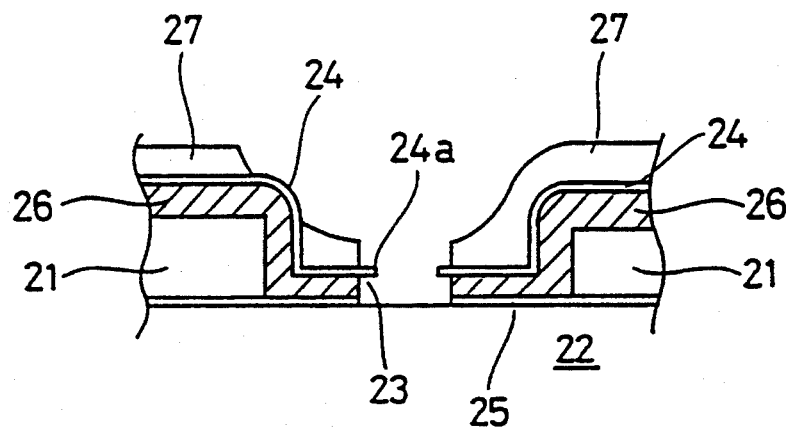
FIG. 2 is a diagram for explaining a construction according to a prior art.

Subsequently, the native oxide film is removed by BHF having the capacity ratio of 100:1, and then an Al wiring pattern 9 is formed on the surface by the known method [see FIG. 1(f)].

Thus, the BPSG layer is deposited and then melted to form the upper insulating layer 7. For coverage improvement, the isotropic etching is carried out by BHF having the capacity ratio of 10:1 to stop at the SiN film 5. Consequently, the gate electrodes 2 and an upper wire are not short-circuited. In addition, the SiN film 5 is not provided in the contact portion 8. In other words, the SiN film 5 is extended outward from the contact pattern portion 6 which is provided on the outside of the contact portion. Accordingly, there can easily be carried out the etching for forming the contact hole. In addition, a SiN hood is not generated.

As described above, only the contact hole portion of the etching barrier layer for angle cutting is removed in advance after deposit. Consequently, there can easily be carried out the dry etching for forming the contact hole. In addition, the hood of the etching barrier layer can be prevented from being generated owing to the isotropic etching by BHF having the capacity ratio of 100:1 to be performed before metal deposit.

What is claimed is:

1. A method for forming a wiring layer on a semiconductor substrate comprising the steps of
   i) laminating a lower insulating layer and etching barrier layer in this order on a top surface of the semiconductor substrate, said top surface including an insulating film and plural electrodes on said insulating film,
   ii) forming a hole in the etching barrier layer to expose a portion of the lower insulating layer by etching using a first mask pattern having a hole in which the diameter of the hole is larger than that of a contact hole to be formed on said top surface between electrodes but smaller than a distance between two electrodes that are totally covered with the etching barrier layer, the electrodes being located most adjacent to each other and sandwiching the contact hole therebetween, followed by removal of the first mask pattern,
   iii) laminating an upper insulating layer on a top surface of the etching barrier layer and the exposed portion of the lower insulating layer so as to form a planarized top surface, followed by lamination of a second mask pattern having a hole pattern in which a diameter of a hole thereof is the same as that of a contact hole to be formed in the top surface of the laminated substrate, said hole pattern being located within the hole in the first mask pattern,
   iv) subjecting a portion of the upper insulating layer to isotropic etching and portions of the upper and lower insulating layers and the insulating film to anisotropic etching in the recited order, using the second mask pattern to form said contact hole such that the etching barrier layer at a side wall of the contact hole is not exposed, and
   v) forming a wiring layer in an area including the contact hole after removal of the second mask pattern.

2. A method of claim 1, wherein the etching barrier layer is made of SiN, polysilicon or amorphous silicon.

3. A method of claim 1, wherein the lower insulation layer is made of at least one layer.

4. A method of claim 1, further including the step of removing a native oxide film within the contact hole prior to forming the wiring layer of step v).

* * * * *